United States Patent [19]
Sempel et al.

[11] Patent Number: 5,430,414
[45] Date of Patent: Jul. 4, 1995

[54] OSCILLATOR CIRCUIT WITH SUPPRESSION OF VOLTAGE TRANSIENTS

[75] Inventors: Adrianus Sempel; Johannes Van Nieuwenburg, both of Eindhoven, Netherlands

[73] Assignee: U.S. Philips Corporation, New York, N.Y.

[21] Appl. No.: 34,931

[22] Filed: Mar. 19, 1993

[30] Foreign Application Priority Data

Apr. 3, 1992 [EP] European Pat. Off. ............ 92200950

[51] Int. Cl.⁶ ............................................. H03K 3/282
[52] U.S. Cl. .................................. 331/111; 331/113 R; 331/143
[58] Field of Search .................. 331/111, 113 R, 143, 331/144

[56] References Cited

U.S. PATENT DOCUMENTS 4,977,381 12/1990 Main ...................................... 331/111
5,021,750 6/1991 Schnable ............................... 331/111

FOREIGN PATENT DOCUMENTS

0296668 12/1988 European Pat. Off. .

*Primary Examiner*—Andrew M. Dolinar
*Attorney, Agent, or Firm*—Bernard Franzblau

[57] ABSTRACT

An electric circuit including a local oscillator circuit and which is adapted to prevent voltage transients. The oscillator circuit comprises two voltage sources which are alternately connected to respective electrodes of a capacitor. The capacitor electrodes are also connected, via respective load circuits, to a common reference node of the voltage sources. Thus, the respective voltage sources alternately generate mutually opposed currents in the capacitor, which currents charge and discharge the capacitor 20 to threshold levels, after which a switching control circuit interchanges the coupling of the voltage sources. In order to prevent a transient in the voltage level at the first capacitor electrode upon switching, a voltage control circuit provides a voltage difference between the voltages supplied by the voltage sources, which voltage difference corresponds to the charge voltage built up across the capacitor.

20 Claims, 3 Drawing Sheets

OSCILLATOR CIRCUIT WITH SUPPRESSION OF VOLTAGE TRANSIENTS

BACKGROUND OF THE INVENTION

This invention relates to an electric circuit comprising an oscillator circuit which comprises a capacitive element, a first and a second electrode of which
- are coupled to a reference node each via a respective load circuit, and are also
- switchably coupled to the reference node via a first and a second voltage source, respectively,
- and are also coupled to respective inputs of a switching control circuit which is coupled to the first and the second voltage source,
  - for controlling a first switching operation where the first electrode is uncoupled from the first voltage source and the second electrode is coupled to the second voltage source, and
  - for controlling a second switching operation where the second electrode is uncoupled from the second voltage source and the first electrode is coupled to the first voltage source,
    - the first and the second switching operation being executed when a capacitance voltage between the first and the second electrode exceeds an upper threshold and drops below a lower threshold, respectively.

An electric circuit of this kind is known from EP-A 0296668, which corresponds to U.S. Pat. No. 4,871,985 (Oct. 3, 1989) and is often used as a local oscillator. In the context of the present Application, a local oscillator is to be understood to mean an oscillator whose oscillation signal, for example as available on the first electrode, is utilized in only a pan of the electric circuit, for example, in a receiver in which it is to be confined to the mixing stage.

The described oscillator is based on the periodic charging and discharging of the capacitive element. This is realised as follows. After the second switching operation, the capacitive element and the load circuit coupled to the second electrode are connected in a first series connection across the first voltage source. A current generated through this first series connection by the first voltage source will charge the capacitive element, giving rise to an increasing voltage between the electrodes of the capacitive element (this voltage will be referred to hereinafter as the capacitance voltage).

When this capacitance voltage exceeds the upper threshold, the first switching operation takes place. The first voltage source is then uncoupled. At the same time, or at least at a later instant, the second voltage source is coupled on and a second series connection, consisting of the capacitive element and the load circuit coupled to the first electrode, is thus connected across the second voltage source. Each of the first and second series connections thus comprises the capacitive element and a load circuit. The difference, however, consists in that the capacitive element in the first and the second series connection is connected to the first and the second voltage source, respectively, via opposite electrodes. Therefore, the second voltage source generates a current which traverses the capacitive element in the opposite direction relative to the current generated by the first voltage source. The current through the second series connection, therefore, will discharge the capacitive element again, resulting in a decreasing capacitance voltage. When this voltage drops below the lower threshold, the second operation takes place and the charging process will be repeated. Periodic charging and discharging are thus achieved.

The voltage at the first electrode is determined alternately by the first voltage source and, via the capacitive element, by the second voltage source. In the circuit disclosed in EP-A 0296668, the voltages delivered by the first and the second voltage source are equal. Therefore, the switching operation will give rise to a voltage transient at the first electrode whose magnitude corresponds to the voltage present across the capacitive element due to the charge built up.

This is an adverse effect in view of parasitic couplings in the circuit, causing the high-frequency components of the oscillator signal to be radiated beyond the part of the circuit served by the oscillator. Because of their high frequency content, the voltage transients will contribute much more to such radiation than the normal increasing and decreasing oscillator voltages during charging and discharging.

SUMMARY OF THE INVENTION

It is, inter alia, an object of the invention to provide an electric circuit in which less undesired signal radiation occurs.

This object is achieved by the electric circuit in accordance with the invention which is characterized in that it comprises a voltage control circuit which is synchronized with the switching control circuit for controlling the first and the second voltage source, so that
- a first voltage difference is imposed between voltages supplied by the first voltage source directly before the first switching operation and by the second voltage source directly after the first switching operation, respectively, and
- a second voltage difference is imposed between voltages supplied by the first voltage source directly after the second switching operation and by the second voltage source directly before the second switching operation, respectively, the first and the second voltage difference corresponding substantially to the capacitance voltage present during the first and the second switching operation, respectively. The voltage differences compensate for the effect exerted by the capacitance voltage on the voltage at the first electrode upon switching. A voltage transient at the first electrode (and hence also at the second electrode) is thus prevented during switching.

Because the capacitance voltage, and hence the required difference voltage, differs during the first and the second switching operation, at least one of the voltage sources must be capable of delivering a variable voltage. Because the first and the second voltage difference correspond to the upper threshold and the lower threshold, respectively, the required voltage differences are known in advance. Therefore, the variable control voltage can in principle be generated by means of a separate circuit.

An embodiment of the electric circuit in accordance with the invention is characterized in that the first and the second electrode are also coupled to respective inputs of the voltage control circuit, the combination of the voltage control circuit and the first and the second voltage source constituting a first and a second differential amplifier, respectively, which transfer variations of the voltage difference across the inputs of the voltage control circuit to the voltages supplied by the first and the second voltage source, a difference of substantially one existing between gain factors of the first and the second differential amplifier. The desired variable voltage difference between the outputs of the voltage sources is derived from the voltage between the first and the second electrode without making use of an additional generating circuit.

An embodiment of the electric circuit in accordance with the invention is characterized in that the gain factors of the first and the second differential amplifier are plus one half and minus one half, respectively. The voltage control circuit can thus be constructed so as to be symmetrical, comprising identical circuits for the first and the second electrode.

A further embodiment of the electric circuit in accordance with the invention is characterized in that the first and the second electrode are also coupled to respective inputs of the voltage control circuit, the latter circuit forming, in combination with the first voltage source, a differential amplifier, which transfers variations of the voltage difference across said inputs to the voltage supplied by the first voltage source with a gain factor of the differential amplifier which is substantially one. Thus, only one of the voltage sources needs to be readjusted.

An embodiment of the electric circuit in accordance with the invention, in which the first voltage source comprises a transistor which is connected as a voltage follower and a voltage follower terminal of which is coupled to the first electrode, is characterized in that outputs of the voltage control circuit and the switching control circuit are connected together to the reference node via a resistive element, a terminal of the resistive element being coupled to a control terminal of the transistor connected as a voltage follower for control purposes. Thus, the currents supplied by the voltage control circuit and the switching control circuit will both flow through the resistive element. This results in a voltage at the control electrode whereby the voltage source is controlled or uncoupled when the control voltage is less than a transistor threshold voltage higher than the minimum achievable output voltage of the voltage follower transistor. The switching of the first electrode and the control of the voltage thereat are thus performed in a combined fashion by means of only one transistor.

An embodiment of the electric circuit in accordance with the invention is characterized in that the load circuits are connected as a current-controlling element. Consequently, the charging current through the capacitive element is determined exclusively by the current-controlling elements and the voltage control circuit has no effect on the time required to charge the capacitive element, i.e. on the oscillator frequency.

An embodiment of the electric circuit in accordance with the invention is characterized in that it is integrated on a semiconductor substrate. When various parts of the electric circuit are integrated on a substrate, substrate currents constitute an important parasitic coupling mechanism. Therefore, for a circuit integrated on a substrate it is especially important to prevent voltage transients and spikes in the oscillator signal so that the advantage of reduced undesirable radiation of signals is achieved.

An embodiment of the electric circuit in accordance with the invention is characterized in that it comprises at least two local oscillators. Anomalies in the value of the upper and the lower threshold of the local oscillator as described above become manifest as frequency disturbances. When several oscillators are used, therefore, for frequency stability it is advantageous to utilize oscillators which exhibit minimum parasitic coupling.

This applies notably to an embodiment of the electric circuit in accordance with the invention which is characterized in that it comprises a multi-channel demodulation circuit. In multi-channel demodulation circuits, for example, demodulation circuits for multi-channel sound in satellite television reception, the higher harmonics of the oscillator signals can be mistaken for higher harmonics of the signal to be received. This leads to incorrect demodulation. Moreover, it is again advantageous to have an as stable as possible frequency.

An embodiment of the electric circuit in accordance with the invention comprises connection terminals for the connection of the capacitive element. Such an electric circuit is suitable for use in a circuit in which the frequency range of the oscillator is defined by way of an externally connected capacitor.

BRIEF DESCRIPTION OF THE DRAWINGS

These and other aspects of the invention will be described in detail with reference to the accompanying drawing; in which.

Figure 1:
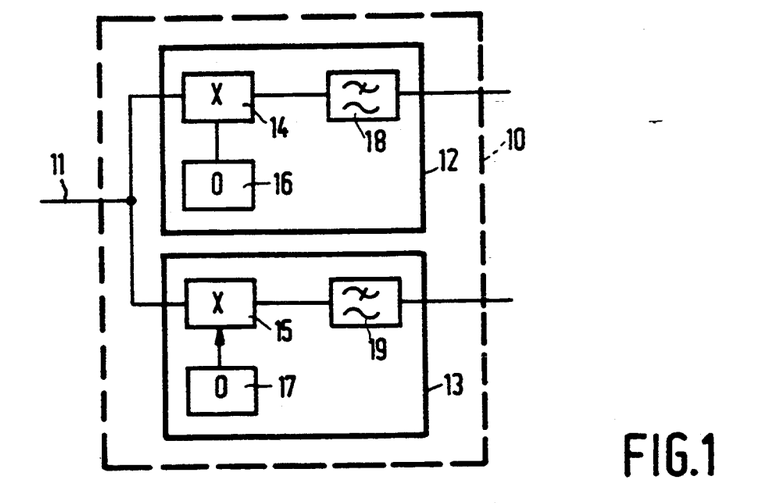
FIG. 1 shows an embodiment of an electric circuit comprising local oscillators.

Many electric circuits comprise one or more oscillators whose signal is used in only a part of the circuit. FIG. 1 diagrammatically shows an example of such a circuit in the form of a multi-channel demodulation circuit 10 as required, for example, for the demodulation of different audio signals in a satellite television signal with more than one audio channel.

The multi-channel demodulation circuit comprises a single input 11 which is coupled to two demodulators 12, 13. Each demodulator comprises a multiplier 14, 15 to which the signal received at the input is applied. In the multipliers 14, 15 the input signal is multiplied by signals from respective oscillators 16, 17, the multiplied signal containing a low-frequency mixing product. The low-frequency mixing product is applied, via low-pass filters 18, 19, to further parts of the circuit (not shown). Moreover, the further parts provide a correction signal for readjustment of the oscillation frequency of the oscillators 16, 17.

The output signals of the oscillators 16, 17 are used at only a limited number of points in the circuit, for example, in the multipliers. The oscillators 16, 17 are therefore referred to as local oscillators. Coupling of the output signal of the oscillators to other parts of the circuit is undesirable. The frequency stability of the oscillators 16, 17 themselves, for example, deteriorates as they receive each other's signals. In another example, undesirable coupling of an oscillator signal to the multiplier associated with the other oscillator, due to (substantial) coincidence of harmonics of signals of these oscillators, can cause further low-frequency mixing products in the multiplied signals, said further low-frequency mixing products dominating the mixing products resulting from the input signal.

These coupling problems will be described in detail with reference to FIG. 2 which shows a circuit diagram of a known oscillator circuit. The central part of this circuit is formed by a capacitive element 20. The operation of the circuit is based on the periodic charging and discharging of the capacitive element. To this end, it comprises a first and a second voltage source 22a, 22b with a common reference node 23. The voltage sources 22a, 22b can be switchably coupled to the first and the second electrode 21a, 21b, respectively, of the capacitive element via switches 26a, 26b. The oscillator circuit also comprises load circuits 24a, 24b which connect the two electrodes 21a, 21b of the capacitive element to the reference node 23.

Figure 2:
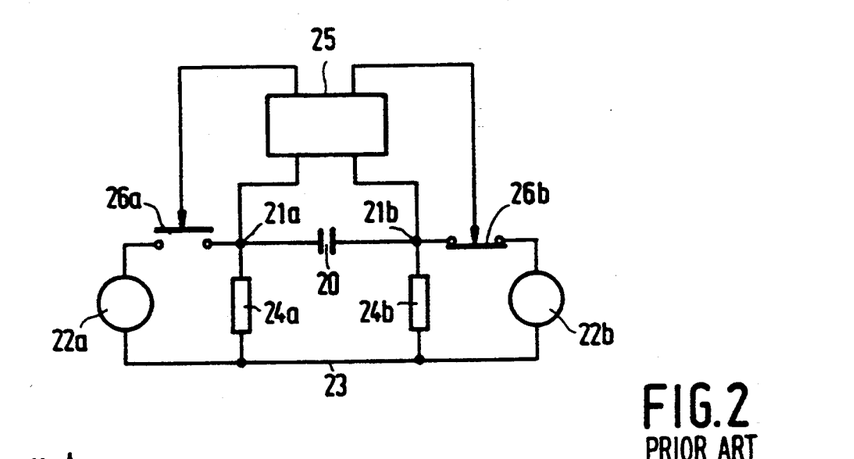
FIG. 2 shows a prior-art oscillator circuit.

As is shown in FIG. 2, the circuit comprises two switches 26a, 26b and is constructed so that it can be switched to two states thereby:

I a first state in which the first switch 26a conducts and the first voltage source 22a is coupled to the first electrode 21a, whereas the second switch 26b is blocked, and II a second state in which the second switch 26b conducts, so that the second voltage source 22b is coupled to the second electrode 21b whereas the first switch 26a is blocked.

The position of the switches 26a, 26b shown in FIG. 2 corresponds to the second state II. The switches 26a, 26b are controlled by a switching control circuit 25. The switching control circuit switches the circuit to the first state when the voltage drop across the capacitive element 20 (the voltage at the first electrode 21a minus that at the second electrode 21b, referred to hereinafter as the capacitance voltage) drops below a lower threshold. When the capacitance voltage increases beyond an upper threshold, the circuit is switched to the second state.

Figure 3:
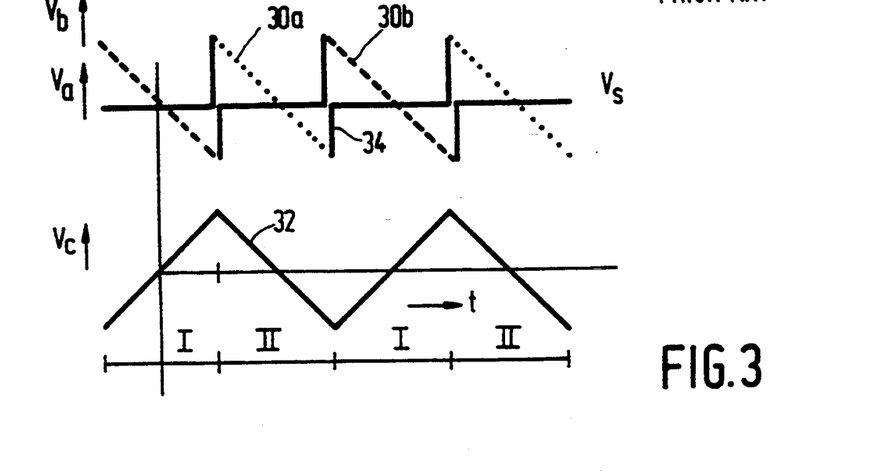
FIG. 3 shows the signals occurring in the prior-art oscillator circuit.

The operation of the circuit shown in FIG. 2 in the form of a circuit diagram will be explained with reference to the signal diagram given in FIG. 3. This Figure shows, as a function of time, the voltage $V_a$30a at the first electrode 21a (heavy lines), the voltage $V_b$30b at the second electrode 21b and (at the bottom) the capacitance voltage $V_c$32. Periods during which the circuit is switched to the first state by the switches 26a, 26b are denoted by the reference I, whereas periods during which the circuit is switched to the second state by the switches 26a, 26b are denoted by the reference II.

In the first state I, the capacitive element 20 and the load circuit 24b, coupled to the second electrode, constitute a series-connected load for the first voltage source 22a. A current generated in this load will charge the capacitive element 20 and will cause an increase of the capacitance voltage $V_c$32. The voltage $V_a$30a at the first electrode 21a is determined completely by the first voltage source 22a and is constant. The voltage $V_b = V_a - V_c$(30b) at the second electrode 21b is equal to the voltage $V_a$30a at the first electrode 21a minus the capacitance voltage $V_c$ and hence decreases.

In the second state II, the capacitive element 20 and the load circuit 24a, coupled to the first electrode, constitute a series-connected load for the second voltage source 22b. Consequently, the second voltage source generates a current through the capacitive element which traverses the capacitive element 20 in the opposite direction relative to the current generated during the first state. The current in the second state II, therefore, causes a decreasing capacitance voltage $V_c$32. The voltage $V_b$30b at the second electrode 21b is determined by the second voltage source 22b in the second state II and is constant, whereas the voltage $30aV_a = Vb + V_c$ at the first electrode 21a equals that of 30b of the second electrode 21b plus the capacitance voltage, and hence decreases.

The switching between the first and the second state I, II is controlled by the switching control circuit 25. When the capacitance voltage $V_c$32 exceeds an upper threshold, the switching control circuit switches the circuit to the second state II by means of the switches 26a, 26b: the first switch 26a is blocked and the second switch 26b becomes conductive. When the capacitance voltage $V_c$32 drops below a lower threshold, the switching control circuit switches the circuit to the first state I by means of the switches 26a, 26b: the first switch 26a becomes conductive and the second switch 26b is blocked.

Upon switching it is ensured that both switches 26a, 26b are not simultaneously conductive. Otherwise, the capacitive element 20 would be abruptly discharged by a large, disturbing current pulse. Because the two switches 26a, 26b are not simultaneously conductive, the capacitive element retains its charge upon switching and hence the capacitance voltage $V_c$ also remains the same during switching.

Because in the known circuit the voltages $V_a$, $V_b$ successively supplied by the first and the second voltage source are equal ($V_s$) and the successive voltages at the non-coupled electrode deviate by one times the capacitance voltage $V_c$, upon switching a transient occurs in the voltages 30a, 30b at the first and the second electrode 21a, 21b. For example, in the first state 1, directly before the switching the voltage 30a at the first electrode will be determined as $V_a = V_s$ by the first voltage source. Directly after the switching, in the second state this voltage $V_a = V_b + V_c = V_s + V_c$ is determined by the voltage supplied by the second voltage source at the second electrode 21b ($V_b = V_s$), but is shifted with respect thereto by the capacitance voltage $V_c$. When the voltages supplied by the first and the second voltage source 22a, 22b are equal ($V_s$) and the capacitance voltage $V_c$ is not equal to zero, therefore, upon switching a transient which is equal to the capacitance voltage during switching will occur in the first voltage 30a at the first electrode. A similar transient occurs in the voltage 30b at the second electrode 21b. A transient will also occur at at least one of the switching instants even when the voltages supplied by the first and the second voltage source are unequal but still time independent.

Due to parasitic couplings to other parts of the circuit, such a voltage transient will give rise to parasitic, undesirable radiation of the oscillator signal. For example, in the case of a parasitic coupling capacitance between crossing conductor paths, a voltage transient will be transferred from one conductor path to the other, causing a voltage pulse which subsists for the time required to discharge the parasitic capacitance. Because of the acute voltage transient, even small parasitic capacitances will have a disturbing effect. In a circuit integrated on a semiconductor substrate, the parasitic capacitance to said substrate will lead to similar couplings.

Such a parasitic signal transfer is undesirable. For example, in a second oscillator circuit of the type shown in FIG. 2 such transfer could cause fluctuations in the thresholding voltages for the switching circuit 25. Such fluctuations become manifest directly as fluctuations of the period duration of the oscillation so that the reception selectivity of a receiver as shown in FIG. 1 is adversely affected thereby.

Figure 4:
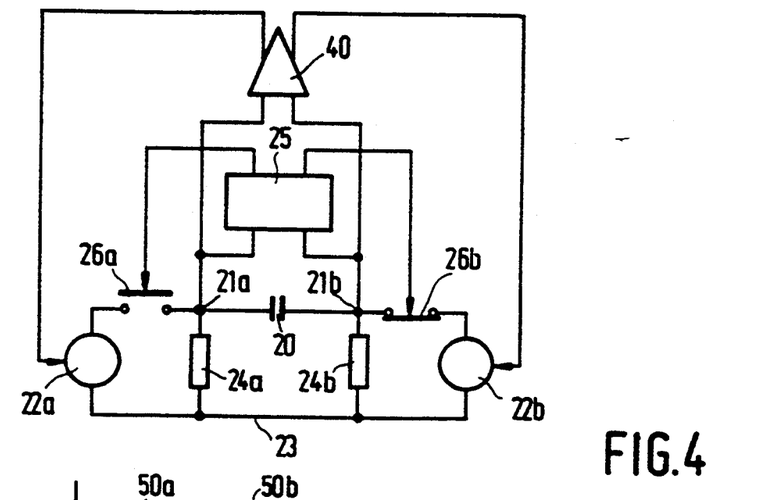
FIG. 4 shows an embodiment of an oscillator circuit in accordance with the invention.

FIG. 4 shows a circuit diagram of an embodiment of the invention whereby voltage transients are avoided. In this and further Figures, components corresponding to those shown in FIG. 2 are denoted by corresponding references; these corresponding components will not be further described.

In accordance with the invention, the oscillator circuit shown in FIG. 4 comprises a voltage control circuit 40. The inputs of this circuit are coupled to the electrodes 21a, 21b of the capacitive element 20. The outputs are coupled to a control input of the voltage sources 22a, 22b. In conjunction with the first voltage source 22a, the voltage control circuit 40 constitutes a first differential amplifier which converts variations of the difference voltage between the electrodes 21a, 21b, that is to say the capacitance voltage $V_c$, with a gain factor of plus one half into variations of the voltage supplied by the first voltage source 22a. In conjunction with the second voltage source 22b, the voltage control circuit 40 constitutes a second differential amplifier which converts variations of the difference voltage between the electrodes 21a, 21b with a gain factor of minus one half into variations of the voltage supplied by the second voltage source 22b. Furthermore, for an input signal amounting to zero, both differential amplifiers have the same offset output voltage $V_o$.

Figure 5:
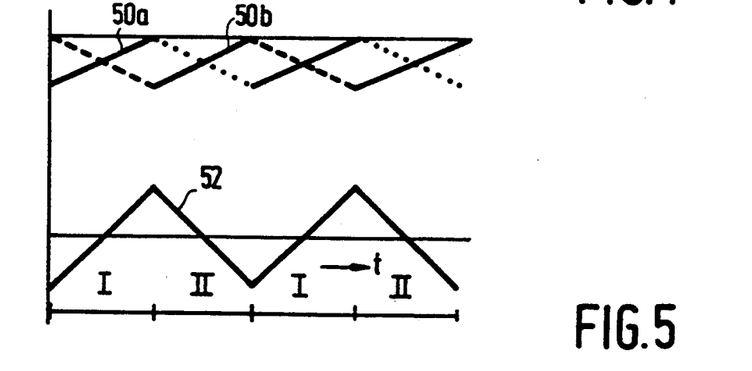
FIG. 5 shows signals occurring in the oscillator circuit in accordance with the invention.

The operation of the oscillator circuit shown in FIG. 4 will be described with reference to FIG. 5. Like FIG. 3, FIG. 5 shows the voltages 50a, 50b at the first and the second electrode 21a, 21b, respectively, and the capacitance voltage 52 as a function of time. The difference with respect to FIG. 3 consists in that in the first state I the voltage control circuit 40 increases the voltage $V_a$50a at the first electrode 21a in proportion to the capacitance voltage $V_c$52. In the second state, the voltage control circuit increases the voltage $V_b$50b at the second electrode 21b, again in proportion to the capacitance voltage $V_c$52, but with the opposite sign. As a result, a difference exists between the voltages which are supplied by the first and the second voltage source 22a, 22b and which separately determine, before and after switching, the voltage at the first and the second electrode 21a, 21b, respectively. This difference equals the capacitance voltage.

For example, prior to the second switching operation, when the first voltage source 22a is coupled to the first electrode 21a, the voltage $V_a = V_o + \frac{1}{2}V_c$50a supplied by the first voltage source 22a is equal to the offset output voltage $V_o$ plus half the capacitance voltage $V_c$. After the second switching operation, when the second voltage source 22b is coupled to the second electrode 21b, the voltage 50b$V_b = V_o - \frac{1}{2}V_c$ supplied by the second voltage source 22b is equal to the offset voltage minus half the capacitance voltage. The difference between the two voltages $V_a$, $V_b$ supplied thus equals the capacitance voltage.

Consequently, immediately after the second switching operation, the voltage $V_a$50a at the first electrode 21a (then being one capacitance voltage higher than the voltage at the second electrode 21b: $V_a = V_b + V_c = (V_o - \frac{1}{2}V_c) + V_c$) is continuous, without a transient, with the voltage $V_a = V_o + \frac{1}{2}V_c$ at the first electrode 21a prior to the second switching operation. The absence of a voltage transient holds for the voltage at the second electrode and prior to the first switching operation.

The offset output voltage $V_o$ of the voltage sources 22a, 22b is taken to be so high that the voltages $V_a$, $V_b$ supplied by the voltage sources 22a, 22b always remain positive. It is thus ensured that the charging current through the capacitive element 20 continues to flow in one direction in each of the states I, II. In principle, however, the variation of the voltages $V_a$, $V_b$(50a, 50b) supplied by the first and the second voltage source 22a, 22b will have an effect on the time required by the capacitive element to be charged to the lower threshold and the upper threshold. If this is undesirable, it is advisable to construct the load circuits 24a, 24b as current-controlling elements, for example, by utilizing for the load circuit the current channel (emitter-collector or source-drain) of a transistor whose control electrode carries a fixed voltage.

Figure 6:
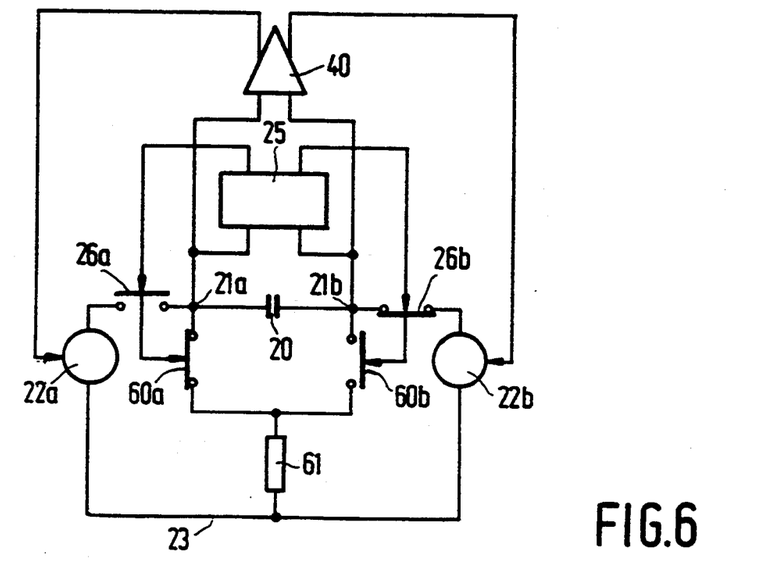
FIG. 6 shows a further embodiment of the oscillator circuit in accordance with the invention.

In each state of the switches only one of the load circuits 24a, 24b is active for the charging of the capacitive element 20. Therefore, use can be made of a single load circuit which is switched to the second electrode in the first state and to the first electrode in the second state. Accordingly, FIG. 6 shows an embodiment of the oscillator circuit in accordance with the invention in which the load circuits comprise a common load 61 which can be connected to the electrodes 21a, 21b of the capacitive element via further switches 60a, 60b, which form a part of the load circuits and which are controlled by the switching control circuit. In the first state I of the oscillator circuit, in which the first switch 26a is conductive, the further switch 60a in the load circuit at the side of the first electrode 21a will be blocked and the further switch 60b in the load circuit at the side of the second electrode 21b will conduct. In the second state, i.e. the state shown in FIG. 6, the further switches 60a, 60b in the load circuits at the side of the first electrode 21a and the second electrode 21b, respectively, are conductive and blocked, respectively.

The voltage sources 22a, 22b need not be coupled directly to the first and the second electrode 21, 21b; coupling can also take place, if desired, via resistive elements such as resistors. When the voltage sources 22a, 22b supply current, such a resistive element will cause a voltage drop between the voltage source 22a, 22b and the electrode 21a, 21b to which it is connected. The difference between the voltages controlled by the voltage control circuit with the first and the second voltage source will also have to compensate for this voltage drop across the resistive elements. When current-controlling load circuits are used, the voltage drop is independent of the capacitance voltage and compensation can be achieved simply by way of an offset between the voltages supplied by the voltage sources.

In order to prevent the transient in the electrode voltage, it suffices for the voltage control circuit to ensure that upon switching a difference corresponding to the capacitance voltage exists between the voltages supplied by the first and the second voltage source 22a, 22b. In order to achieve this, it suffices that a difference equal to one exists between the gain factors of said first and second differential amplifiers (formed by the voltage control circuit 40 in conjunction with the first voltage source 22a and in conjunction with the second voltage source 22b, respectively). In addition to the already mentioned gain factors of plus and minus one half, for example the gain factor of the first differential amplifier may be chosen to be one and that of the second differential amplifier as zero. In this case the coupling of the voltage control circuit 40 to the second voltage source consists merely of a time-independent reference connection.

In order to operate with a minimum supply voltage, furthermore, it is desirable that the absolute values of the gain factors be smaller than one. The reason for this is the following. The capacitance voltage should preferably have a range which is greater than the transistor threshold voltages. This is because the thresholding of transistors can then be used directly for the detection of the exceeding of the lower and upper threshold in the switching control circuit. The capacitance voltage as well as the voltages supplied by the voltage sources, however, must always remain smaller than the supply voltage, so that the latter should certainly be greater than a transistor threshold voltage. If the gain factors are smaller than one in an absolute sense, the range of the voltages supplied by the voltage sources 22a, 22b will be smaller than that of the capacitance voltage. Consequently, these voltages do not impose more severe requirements in respect of the supply voltage. This is desirable for operation with a low supply voltage as in the case of battery powered apparatus such as, for example, portable telephones.

Only the difference between the voltage supplied by the first and the second voltage source 22a, 22b upon switching is of importance in preventing voltage transients. Therefore, the differential amplifiers need not be linear amplifiers for as long as the gain factors differ by one for an input signal equal to the upper and the lower threshold. Because the desired difference upon switching (the upper and the lower threshold) is known the use of amplifiers can even be dispensed with and instead a separate signal generator circuit can be used for voltage control, which circuit provides the desired differences in synchronism with the switching and without further use of the measured capacitance voltage.

Figure 7:
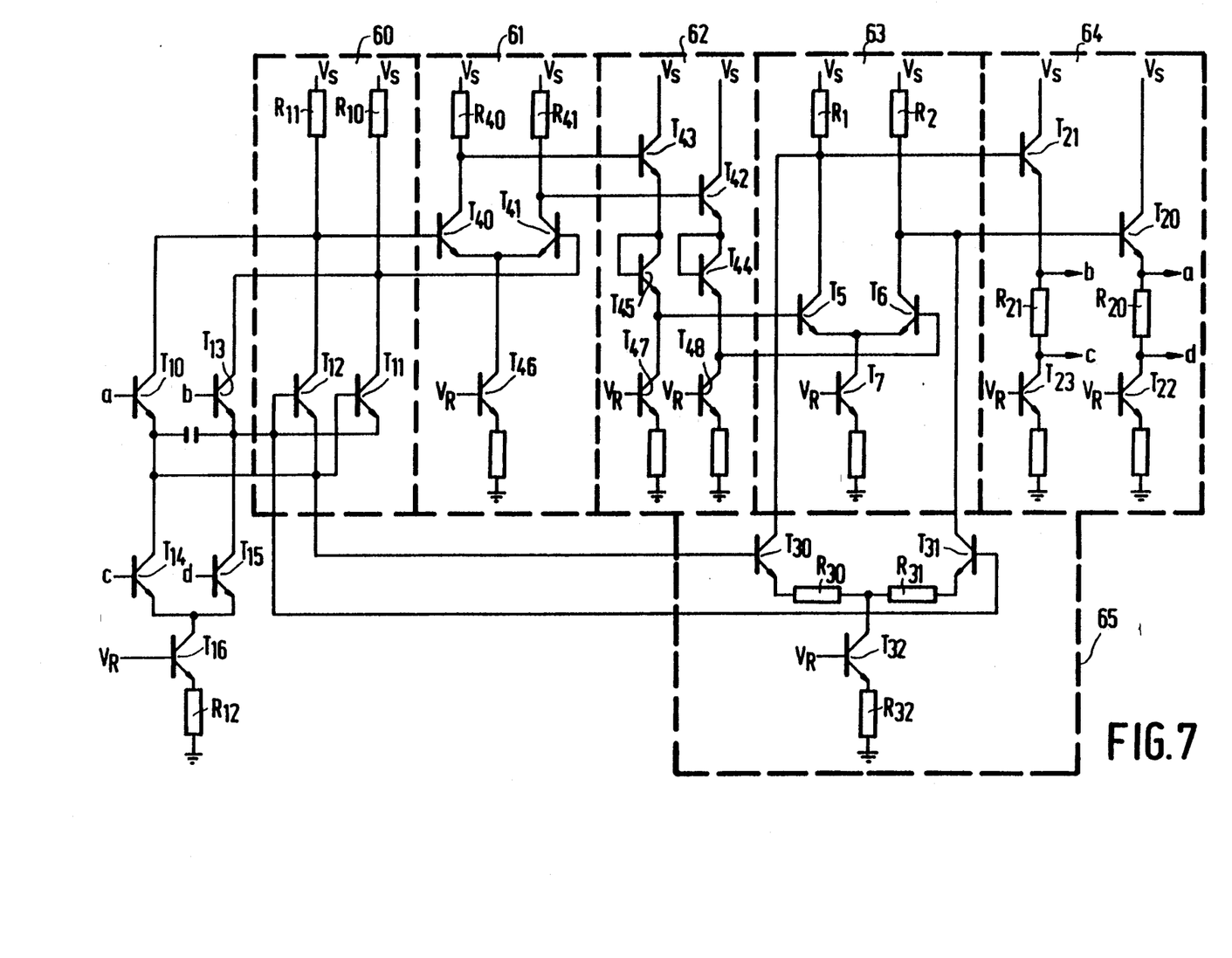
FIG. 7 is a circuit diagram of an embodiment of the invention.

FIG. 7 shows an embodiment of the oscillator circuit in accordance with the invention in which the oscillator circuit is constructed using bipolar transistors. The capacitive element 20 again forms the central part of this embodiment. Coupled to the capacitive element is the switching control circuit 25 which comprises a cascade of successively a differential input stage 60 (comprising two transistors T11, T12 for amplification in the case of a positive and a negative capacitance voltage, respectively), a differential amplifier stage 61, an emitter-follower/level shift stage 62, a further amplifier 63, and a coupling-out stage 64. The switching control circuit is connected to the control input of two emitter-follower transistors T10, T13 which serve as the first and the second voltage source 92a, 22b.

Via supplementary level-shift resistors R20, R21, the switching control circuit is also connected to the control input of two current-switching transistors T14, T15 which form part of the load circuits 24a, 24b. The load circuits 24a, 24b are formed further by a current-controlling circuit T16, R12.

The embodiment shown in FIG. 7 also comprises a voltage control circuit which successively comprises a differential input stage 65 and a coupling-out stage 64.

The operation of this embodiment is as described with reference to FIGS. 2 and 4, the emitter-follower transistors T10 and T13 acting as the voltage sources 22a, 22b as well as the switches 26a, 26b. Outside the instant of switching, one of the emitter followers T10, T13, acting as the voltage sources, receives a base voltage which is so much higher than that of the other emitter follower that only said one emitter follower is turned on. One of the transistors in the load circuits T14, T15 also receives a base voltage which is so much higher than that of the other transistor that only said one transistor is turned on, that is to say the transistor which is connected in series with the turned-on emitter follower via the capacitive element 20. Thus, in a first example T10 and T15 will be turned on together and T13 and T14 will be turned off, whereas in a second example T13 and T14 will be turned on when T10 and T15 are turned off. In the first example, which will be elaborated upon hereinafter, a current which is determined by a current-controlling transistor T16 flows from the power supply $V_s$, via the resistor R10, the emitter follower T10, the capacitive element 20 and the load T15, T16, R12. No current flows through the resistor R11, so that a voltage drop occurs across R10 but not across R11. The amplifier stage 61 receives an input difference voltage which corresponds to the difference between these voltage drops. This difference voltage is further amplified in the voltage control circuit, so that the latter is saturated in the sense that T5 in the further amplifier stage is turned on and T6 is not turned on. As a result, T10 and T15 receive a high base voltage so that they are turned on, whereas T13 and T14 receive a low voltage and are not turned on. The current generated by the load circuit thus flows via the capacitive element and T10 and T15. This current charges the capacitive element 20 and causes an increasing capacitance voltage.

The capacitance voltage is applied to the input stage 60, T11, T12 of the switching control circuit. At the beginning of the charging of the capacitive element 20, this voltage is too low to turn on the input transistors T11, T12 of the switching control circuit whose base-emitter junctions are connected via the capacitive element 20. As the capacitive element 20 is charged further, one of the input transistors will be turned on at a given instant. In the example where T10 and T15 are turned on, T11 will be turned on in the course of time. The current supplied by the load circuit R12, T16, T15 will thus flow mainly through the turned-on transistor T11. If, to begin with, a voltage drop occurred across only one of the collector resisters R10, R11, i.e. across R10, the voltage drop across said one resistor R10 will thus decrease and that across the other resistor R11 will increase.

As soon as the input transistor T11 draws more than half the current, the sign of the input signal at the amplifier stage 60 in the switching control circuit changes. Via the further stages of the switching control circuit 60, 61, 62, 63, 64, this causes a change of the voltage at the base connections of the emitter-follower transistors T10, T13 and the transistors of the load circuits T14, T15. As a result, the turned-on transistors (T10, T15 in the above example) are turned off and the previously turned-off transistors (T13, T14) are turned on. Consequently, the current direction through the capacitive element 20 is reversed and this element will be discharged again, producing an oscillation as described with reference to FIG. 2.

The operation of the voltage control circuit 65, 64 added to the diagram of FIG. 6 in accordance with the invention, is as follows. The capacitance voltage is applied to the base terminals of two transistors T30, T31, the emitters of which are connected via equal emitter resistances R30, R31, thus producing a difference between the currents I30, I31 through their collectors. The emitter resistances provide a suitable linear relationship between this difference between the currents and the input voltage. Provided that the emitter resistances are sufficiently high to ignore the transistor properties (which is assumed for the sake of simplicity), this current difference is given by:

$$I_{31} - I_{30} = 2V_{cap}/(R_{30} + R_{31})$$

The collector currents I30, I31 also flow through respective resistors R1, R2 which also form a part of the switching control circuit. Outside the instant of switching, the switching control circuit will conduct current through only one of these two resistors R1, R2 (only through R1 in the example where T10 and T15 are turned on). The voltage drop across the other resistor (R2 in the example) relative to the supply voltage Vs, therefore, is determined completely by the collector current of one of the transistors of the voltage control circuit (by I31 in the example). This voltage drop is transferred to the base of the turned-on emitter-follower transistor (T10 in the example), via one of the coupling-out transistors T20, T21 (via T20 to T10 in the example). Thus, variations of the collector current I30, I31 are always transferred to the output voltage of the turned-on emitter-follower transistor T10, T13 acting as the voltage source 22a, 22b. The difference between the voltages V10, V13 supplied by the emitter followers T10, T13 before and after the switching operation is proportional to the difference between the collector currents:

$$V_{10} - V_{13} = (R_1 + R_2)V_{cap}/(R_{30} + R_{31})$$

The embodiment of the oscillator circuit in accordance with the invention is constructed so that the two sums $(R_1 + R_2)$ and $(R_{30} + R_{31})$ are equal. The differential amplifiers formed by the voltage control circuit (T32, R32, T30, R30, R1, T21 and T31, R31, R2, T20) and the emitter-follower transistors T10, T13 thus have a gain which differs by exactly one. As has already been described with reference to FIG. 4, transients are thus prevented in the voltage at the electrodes of the capacitive element 20. In the special case where R1=R2=R30=R31, the gains are, for example, plus and minus one half and the circuit for controlling the two voltage sources is identical.

When the transistor contributions to the difference $V_{10} - V_{13}$ cannot be ignored, evidently it will be necessary to select the resistors R30 and R31 or R1, R2 accordingly.

As from the resistors R1, R2, the switching control circuit and the voltage control circuit utilize common components (R1, T21, R2, T20). This is possible because in each of the two states of the oscillator circuit the switching control circuit generates current through only one of these resistors. The current through the other resistor is determined exclusively by the voltage control circuit and serves to generate the desired voltage difference in the control of the electrodes 21a, 21b before and after switching.

The load circuits (T14, T15, T16, R12) in FIG. 7 have a common current control circuit (T16, R12). This common circuit comprises a transistor T16 whose base receives a constant voltage whereby the collector current is controlled. This collector current is alternately applied to the first load circuit (T14, T16, R12) and the second load circuit (T15, T16, R12). Switching over between these load circuits takes place substantially simultaneously with the coupling-on and coupling-off of the voltage sources T10, T13 because the load circuits as well as the coupling-off are controlled by the same transistors T20, T21.

Even though the electric circuit comprising a local oscillator in accordance with the invention has been described on the basis of a bipolar circuit, it will be evident that the invention is not restricted to bipolar circuits. The invention also is not restricted to local oscillators serving demodulation circuits; it can be universally applied and is useful notably for all electric circuits where crosstalk of oscillator signals is to be minimized.

The circuit in accordance with the invention will preferably be integrated on a semiconductor substrate. In this case all of the components of the electric circuit are arranged just above the substrate, thus causing parasitic couplings. The drawbacks thereof, in the form of more than local radiation of oscillator signals, are reduced by the circuit in accordance with the invention. When the circuit is integrated, the capacitive element will usually also be integrated. When the oscillation frequency is to be externally determined or when a capacitance value is required which is difficult to integrate, however, the electric circuit may also be provided with external connection pins for connection of the capacitive element 20. In that case it is not necessary to build in the capacitive element during manufacture.

We claim:

1. An electric circuit, comprising an oscillator circuit which comprises a capacitive element, a first and a second electrode of which
   are coupled to a reference node each via a respective load circuit, and are also
   switchably coupled to the reference node via a first and a second voltage source, respectively
   and are also coupled to respective inputs of a switching control circuit which is coupled to the first and the second voltage source,
      for controlling a first switching operation where the first electrode is uncoupled from the first voltage source and the second electrode is coupled to the second voltage source, and
      for controlling a second switching operation where the second electrode is uncoupled from the second voltage source and the first electrode is coupled to the first voltage source,
      the first and the second switching operation being executed when a capacitance voltage between the first and the second electrode exceeds an upper threshold and drops below a lower threshold, respectively,
wherein the oscillator circuit comprises a voltage control circuit synchronized with the switching control circuit for controlling the first and the second voltage source so that
   a first voltage difference is imposed between voltages supplied by the first voltage source directly before the first switching operation and by the second voltage source directly after the first switching operation, respectively, and
   a second voltage difference is imposed between voltages supplied by the first voltage source directly after the second switching operation and by the second voltage source directly before the second switching operation, respectively, the first and the second voltage difference corresponding substantially to the capacitance voltage present during the first and the second switching operation, respectively.

2. An electric circuit as claimed in claim 1, wherein the first and the second electrode of the capacitive element are also coupled to respective inputs of the voltage control circuit, the combination of the voltage control circuit and the first and the second voltage source comprising a first and a second differential amplifier, respectively, which transfer variations of the voltage difference across the inputs of the voltage control circuit to the voltages supplied by the first and the second voltage source, a difference of substantially one existing between gain factors of the first and the second differential amplifier.

3. An electric circuit as claimed in claim 2, wherein the gain factors of the first and the second differential amplifier are plus one half and minus one half, respectively.

4. An electric circuit as claimed in claim 3 wherein the first voltage source comprises a transistor which is connected as a voltage follower and a voltage-follower terminal of which is coupled to the first electrode, wherein outputs of the voltage control circuit and the switching control circuit are connected together to the reference node via a resistive element, a terminal of the resistive element being coupled to a control terminal of the transistor connected as a voltage follower for control purposes.

5. An electric circuit as claimed in claim 2 or wherein the first voltage source comprises a transistor which is connected as a voltage follower and a voltage-follower terminal of which is coupled to the first electrode, wherein outputs of the voltage control circuit and the switching control circuit are connected together to the reference node via a resistive element, a terminal of the resistive element being coupled to a control terminal of the transistor connected as a voltage follower for control purposes.

6. An electric circuit as claimed in claim 2 wherein the load circuits are connected as a current-controlling element.

7. An electric circuit as claimed in claim 2 and which is integrated on a semiconductor substrate.

8. An electric circuit as claimed in claim 1, wherein the first and the second electrode of the capacitive element are also coupled to respective inputs of the voltage control circuit, the voltage control circuit forming, in combination with the first voltage source, a differential amplifier which transfers variations of the voltage difference across said inputs to the voltage supplied by the first voltage source and with a gain factor of the differential amplifier which is substantially one.

9. An electric circuit as claimed in claim 1 wherein the load circuits are connected as a current-controlling element.

10. An electric circuit as claimed in claim 1 and which is integrated on a semiconductor substrate.

11. An electric circuit as claimed in claim 1 and which comprises at least two local oscillators.

12. An electric circuit as claimed in claim 11, which comprises a multi-channel demodulation circuit.

13. An electric circuit for use in an electric circuit comprising a local oscillator circuit as claimed in claim 1, comprising connection terminals for connection of the capacitive element.

14. An oscillator circuit comprising:
a capacitor having first and second electrodes,
means including at least one load circuit for coupling said first and second capacitor electrodes to a reference node,
first and second voltage sources,
first and second switching means for alternately coupling said first and second capacitor electrodes to the reference node via said first and second voltage sources, respectively,
a switching control circuit having input means coupled to said capacitor first and second electrodes and output means for controlling the alternate operation of the first and second switching means so that the first and second voltage sources alternately produce first and second currents of opposite polarity in the capacitor thereby to alternately charge and discharge the capacitor to an upper and lower voltage threshold at which the switching control circuit operates the first and second switching means, respectively, and
a voltage control circuit synchronized to the switching control circuit for controlling at least one of said voltage sources such that upon switching a voltage is produced at at least one of said capacitor electrodes which corresponds to a charge voltage developed across the capacitor.

15. The oscillator circuit as claimed in claim 14 wherein said voltage control circuit has input means coupled to said capacitor first and second electrodes and has first and second outputs coupled to respective voltage control inputs of the first and second voltage sources.

16. The oscillator circuit as claimed in claim 14 further comprising:
third and fourth switching means alternately controlled by the switching control circuit for alternately coupling said capacitor first and second electrodes to said reference node via said one load circuit.

17. The oscillator circuit as claimed in claim 16 wherein the first and third switching means are coupled to the capacitor first electrode and the second and fourth switching means are coupled to the capacitor second electrode, and said switching control circuit operates said switching means so that the second and third switching means are opened and closed at the same time and said first and fourth switching means are open and closed at the same time.

18. The oscillator circuit as claimed in claim 14 further comprising a second load circuit, and wherein said one load circuit couples the capacitor first electrode to the reference node and the second load circuit couples the capacitor second electrode to the reference node.

19. The oscillator circuit as claimed in claim 18 wherein said first voltage source and said one load circuit are coupled in parallel between the capacitor first electrode and the reference node when the first switching means is closed and said second voltage source and said second load circuit are coupled in parallel between the capacitor second electrode and the reference node when the second switching means is closed.

20. The oscillator circuit as claimed in claim 14 wherein the voltage control circuit comprises:
a first differential amplifier comprising first and second transistors with their emitters connected to the reference node via respective first ($R30$) and second ($R31$) resistors and a common current source and their collectors coupled to a source of d.c. supply voltage via respective third ($R1$) and fourth ($R2$) resistors, and wherein the resistance values of said resistors are chosen so that $R1+R2=R30+R31$.

* * * * *